United States Patent
Lavedas et al.

(10) Patent No.: US 10,963,655 B1
(45) Date of Patent: Mar. 30, 2021

(54) DIPLEXED NEAR-FIELD SENSOR

(71) Applicant: Raytheon Company, Waltham, MA (US)

(72) Inventors: Thomas G. Lavedas, Clifton, VA (US); Firat Kara, Burke, VA (US)

(73) Assignee: Raytheon Company, Waltham, MA (US)

(*) Notice: Subject to any disclaimer, the term of this patent is extended or adjusted under 35 U.S.C. 154(b) by 0 days.

(21) Appl. No.: 16/693,739

(22) Filed: Nov. 25, 2019

(51) Int. Cl.
| | | |
|---|---|---|
| *G06K 7/10* | (2006.01) | |
| *H03H 7/38* | (2006.01) | |
| *H02H 9/00* | (2006.01) | |
| *H03F 3/189* | (2006.01) | |

(52) U.S. Cl.
CPC ......... *G06K 7/10297* (2013.01); *H02H 9/005* (2013.01); *H03F 3/189* (2013.01); *H03H 7/38* (2013.01); *H03F 2200/294* (2013.01)

(58) Field of Classification Search
CPC .... G06K 7/10297; H02H 9/005; H03F 3/189; H03F 2200/294; H03H 7/38
USPC .......................................................... 235/451
See application file for complete search history.

(56) References Cited

U.S. PATENT DOCUMENTS

| | | | |
|---|---|---|---|
| 7,714,791 B2 | 5/2010 | Lavedas | |
| 10,340,965 B2 | 7/2019 | Dolgin et al. | |
| 2018/0041244 A1* | 2/2018 | Ding | H03F 3/245 |
| 2019/0165754 A1* | 5/2019 | Zolomy | H03F 1/565 |

* cited by examiner

*Primary Examiner* — Daniel A Hess

(74) *Attorney, Agent, or Firm* — Daly, Crowley, Mofford & Durkee, LLP

(57) ABSTRACT

In some embodiments, a near-field sensor comprises an antenna system, transmit circuitry configured to transmit pulses via the antenna system, and receive circuitry configured to receive interrogation signals in response to transmitted pulses. The antenna system can include a first conductive path having one or more loops coupled together, and a second conductive path having one or more loops coupled together, wherein the first and second conductive path are electrically isolated from each other within the antenna system. The transmit circuitry can include a matching network to dissipate energy stored in the transmit circuitry following transmission of a pulse. The receive circuitry can include a suppression network configured to dissipate residual energy within the receive circuitry resulting from transmission of the pulse.

18 Claims, 10 Drawing Sheets

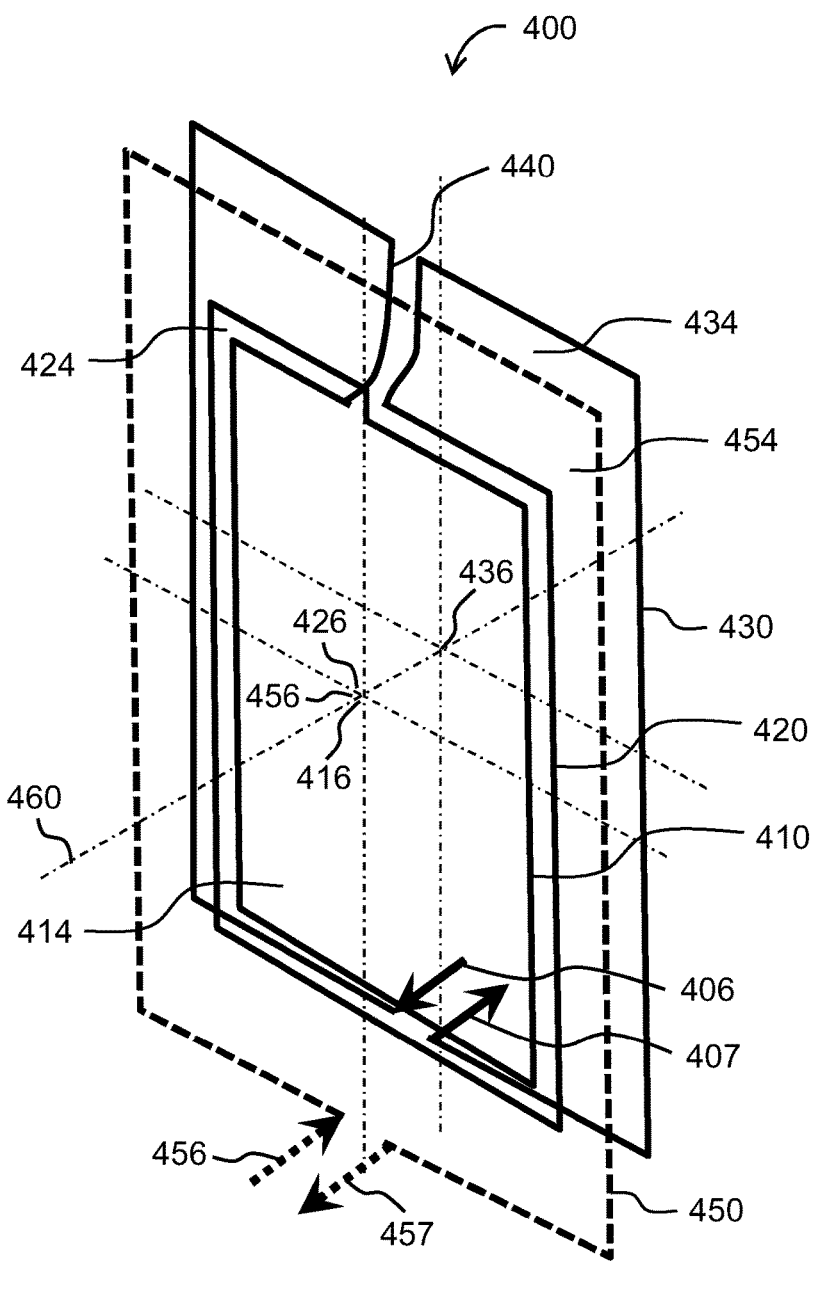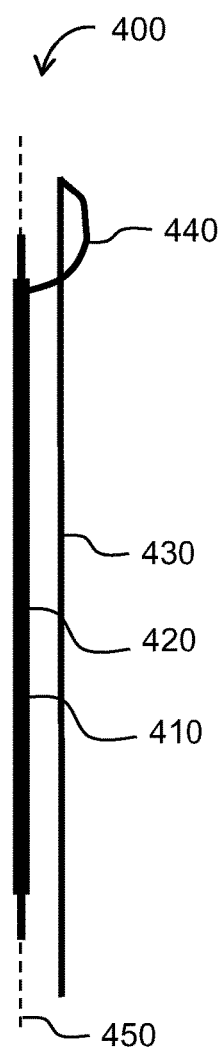
FIG. 4  FIG. 4A

DIPLEXED NEAR-FIELD SENSOR

BACKGROUND

As is known in the art, near-field sensors, such as high frequency RFID (radio frequency identification) interrogators and some radio frequency (RF) spectroscopy sensors, impose differing requirements on their transmit and receive functions. For example, it may be desirable to suppress the creation of fields far from a sensor while maintaining a desired field strength in the vicinity of the sensor.

Existing near-field sensors may include an antenna system having a single conductive path or probe (e.g., a single magnetic loop) used for both transmit and receive functions. Such dual use can compromise performance of the transmit function, the receive function, or both. It can also add to the complexity of the system. For example, some high power RF spectroscopy systems require the introduction of a tuned quarter wave-length section, either using transmission line or a lumped element filter sections, to provide a desired amount of isolation between signals in the transmitter and signals in the receiver when the transmitter and the receiver are attached to the same conductive path of the antenna system.

As is also known, with near-field sensors, it may be desirable to rapidly dissipate energy stored in a probe following transmission of a pulse signal. Because the probe may be tuned to a high quality factor (Q factor), the inherent dissipation time can be much longer than desired. Existing near-field sensor designs can include a switched circuit operable to increase the speed of energy dissipation. However, existing designs may result in unacceptably high stress on the switch and the other components which make up the switch circuit used to accomplish this suppression function. That is, with existing designs, voltage and/or currents may exceed those of the intended operation of the sensor.

Attempts have been made to address limitations of near-field sensor systems, such as the problem of environmental noise found in the frequency spectrum associated with RF spectroscopy. For example, U.S. Pat. No. 7,714,791 ("the '791 patent") describes a differential near field probe that can be used in near-field sensor systems. The '791 patent is herein incorporated by reference in its entirety.

SUMMARY

According to one aspect of the present disclosure, a near-field sensor device can include an antenna system, transmit circuitry configured to transmit pulses via the antenna system, and receive circuitry configured to receive interrogation signals in response to transmitted pulses. The antenna system may include a first conductive path having one or more loops coupled together and a second conductive path having one or more loops coupled together, wherein the first conductive path is electrically isolated from the second conductive path within the antenna system. The transmit circuitry can include a first port coupled to a power amplifier, a second port coupled to the second conductive path, and a transmit matching network coupled between the first and second ports. The transmit matching network may be configured to dissipate energy stored in the transmit circuitry following transmission of a pulse. The receive circuitry can be include a third port coupled to the first conductive path, a fourth port coupled to a low-noise amplifier, and a receive matching/suppression network coupled between the third and fourth ports, the receive matching/suppression network configured to dissipate residual energy within the receive circuitry resulting from transmission of the pulse.

In some embodiments, the transmit matching network may include a plurality of capacitors coupled in parallel between the first and second port and, for each of one or more of the plurality of capacitors, a pair of crossed diodes coupled in series with the capacitor. In some embodiments, the transmit matching network may include a first number of pairs of crossed diodes coupled in series with a first one of the plurality of capacitors and a second number of pairs of crossed diodes coupled in series with a second one of the plurality of capacitors, wherein the first and second numbers of pairs of crossed diodes are different. In some embodiments, within the transmit matching network, at least one of the plurality of capacitors is directly coupled to the second conductive path of the antenna system. In some embodiments, the transmit matching network can include, for each of the one or more of the plurality of capacitors, a switching element coupled in parallel with the pair of crossed diodes and a resistor coupled in parallel with the pair of crossed diodes.

In some embodiments, the receive matching/suppression network can include an impedance matching network coupled to the third port and a transient suppression network coupled to the impedance matching network and the fourth port. In some embodiments, the impedance matching network can include one or more first capacitors coupled in parallel to the third port and one or more second capacitors coupled in series with the one or more first capacitors. In some embodiments, the transient suppression network can include a network coupled in parallel between the third and fourth ports, an inductor coupled in series with a resistor coupled in parallel between the third and fourth ports, and a switching element having a first position and a second position. The switching element may be configured to, in the first position, provide signal path between the first conductive path and the low-noise amplifier, and, in the second position, provide signal path between the first conductive path and the series-coupled resistor and inductor.

In some embodiments, the one or more loops of the first conductive path may be disposed within and substantially parallel to the one or more loops of the second conductive path. In some embodiments, the one or more loops of the first conductive path can be oriented along a first plane and the one or more loops of the second conductive path are oriented along a second plane offset from the first plane. In some embodiments, the first conductive path may include a first loop having at least one first conductor and a second loop having at least one second conductor, and an outer loop coupled to the first and second loops.

According to another aspect of the present disclosure, a transmit matching network may be provided for use in a near-field sensor device having isolated transmit and receive probes. the transmit matching network can include: a first port coupled to a power amplifier; a second port coupled to the transmit probe; a plurality of capacitors coupled in parallel between the first and second ports; and for each of one or more of the plurality of capacitors, a pair of crossed diodes coupled in series with the capacitor.

In some embodiments, the transmit matching network can include a first number of pairs of crossed diodes coupled in series with a first one of the plurality of capacitors and a second number of pairs of crossed diodes coupled in series with a second one of the plurality of capacitors, wherein the first and second numbers of pairs of crossed diodes are different. In some embodiments, at least one of the plurality of capacitors may be directly coupled to the transmit probe.

In some embodiments, the transmit matching network can include, for each of the one or more of the plurality of capacitors, a switching element coupled in parallel with the pair of crossed diodes and a resistor coupled in parallel with the pair of crossed diodes.

According to another aspect of the present disclosure, a matching/suppression network may be provided use in a near-field sensor device having isolated transmit and receive probes. The matching/suppression network can include a first port coupled to the receive probe, a second port coupled to a low-noise amplifier, an impedance matching network coupled to the first port, and a transient suppression network coupled to the impedance matching network and the second port. In some embodiments, the impedance matching network can include one or more first capacitors coupled in parallel to the first port and one or more second capacitors coupled in series with the one or more first capacitors.

In some embodiments, the transient suppression network may include a network coupled in parallel between the first and second ports, an inductor coupled in series with a resistor coupled in parallel between the first and second ports, and a switching element having a first position and a second position. The switching element may be configured to, in the first position, provide signal path between the receive probe and the low-noise amplifier, and, in the second position, provide signal path between the receive and the series-coupled resistor and inductor.

BRIEF DESCRIPTION OF THE DRAWINGS

Various objectives, features, and advantages of the disclosed subject matter can be more fully appreciated with reference to the following detailed description of the disclosed subject matter when considered in connection with the following drawings, in which like reference numerals identify like elements.

FIG. 4 is a perspective view of another antenna system that can be used within a near-field sensor, according to embodiments of the present disclosure.

FIG. 4A is a side view of the antenna system shown in FIG. 4.

The drawings are not necessarily to scale, or inclusive of all elements of a system, emphasis instead generally being placed upon illustrating the concepts, structures, and techniques sought to be protected herein.

DETAILED DESCRIPTION

Figure 1:
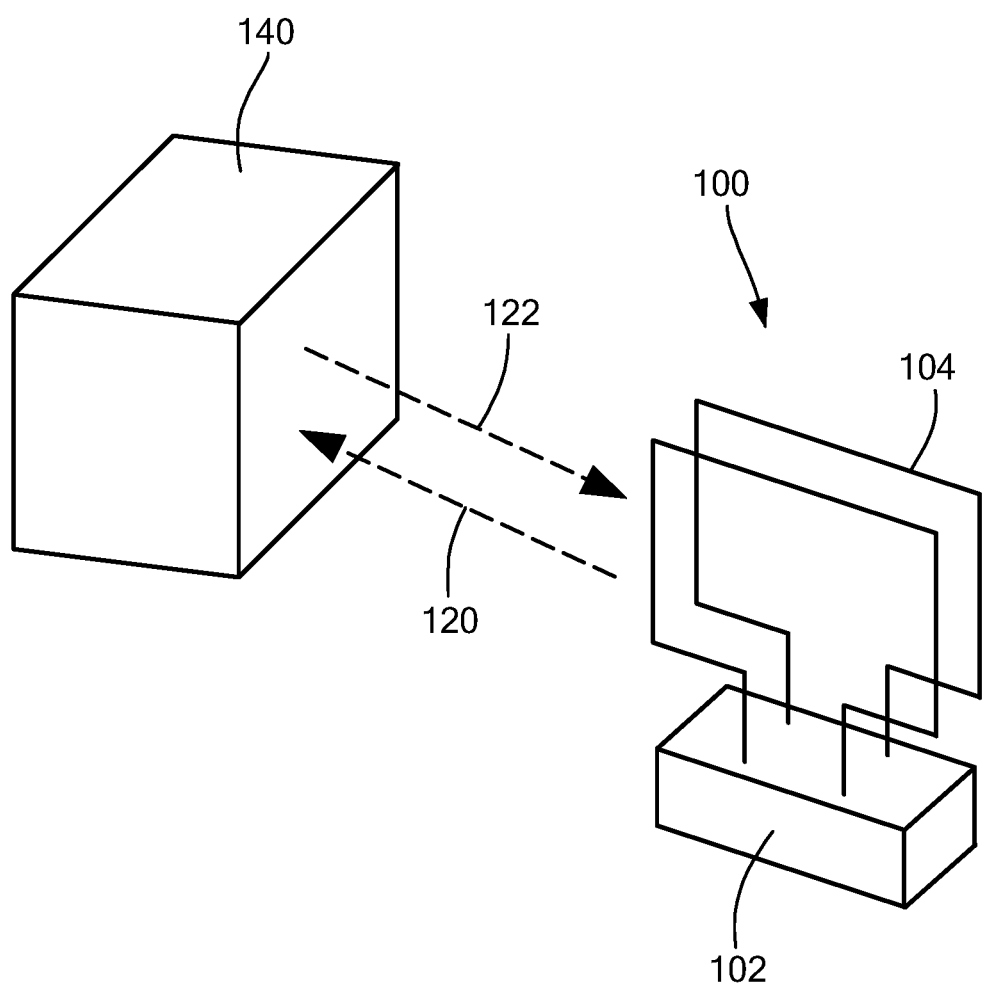
FIG. 1 is a pictorial view of an environment in which a near-field sensor can be used, according to embodiments of the present disclosure.

FIG. 1 shows an environment in which embodiments of a near-field sensor 100 can operate. The illustrative sensor 100 can include transmit-receive circuitry 102 electrically coupled to an antenna system 104. The antenna system 104 may include a one or more conductive paths (or "probes") for transmitting transmit signals (such as "pulse signals" or more simply "pulses," for example) 120 to a target 140 and receiving receive signals 122 in response.

The concepts, structures, and techniques sought to be protected herein can be used in various applications, including but not limited to inventory tracking and detection of explosives and other materials. For example, one or more sensors 100 may be located at various points along a supply chain to monitor advancements of inventory. In such inventory tracking applications, target 140 may correspond to inventory affixed with an RFID tag and sensor 100 may correspond to an RFID station. In RFID applications, the receive signals 122 may correspond to signals generated by an RFID tag affixed to the target 140 in response to an initiate-communications signal transmitted by sensor 100. As another example, sensor 100 may be deployed in an airport, border crossing, or other security checkpoint to interrogate potentially dangerous (e.g., explosive) packages or other types of targets 140 using spectroscopy. In spectroscopy applications, receive signals 122 may correspond to radiated energy emitted by the target 140 in response to transmit pulses 120 interacting with one or more materials of target 140.

Generally, near-field sensing applications (e.g., explosive detection applications) involve transmitting a strong excitation signal 120 from a probe 104 and receiving a relatively weak signal 122 from the target 140 being interrogated after the transmit pulse ends. The sensitivity of sensor 100 is dependent upon its ability to differentiate the relatively low power of the receive signal 122 from the relatively high power of the interrogating transmit pulses 120.

Figure 2:
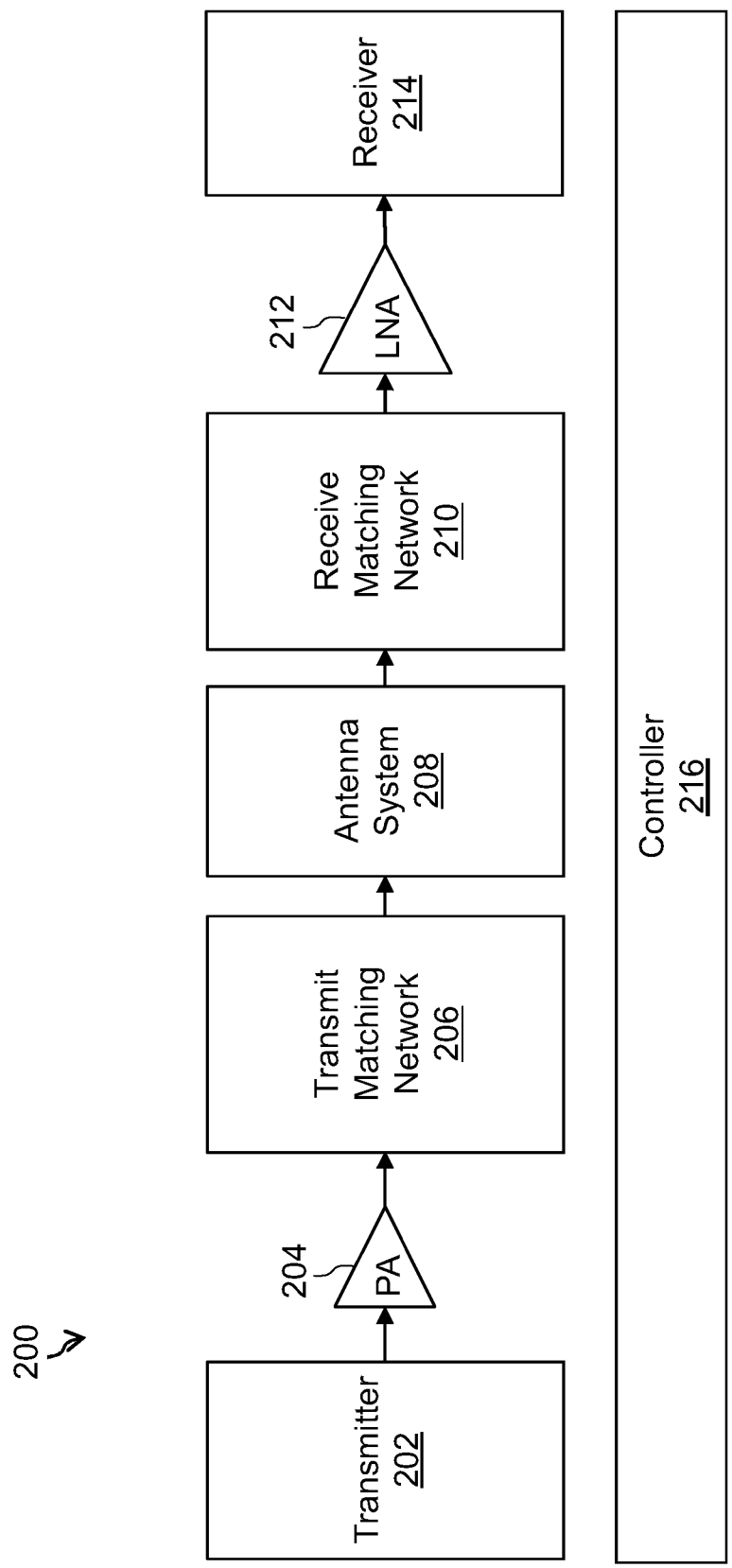
FIG. 2 is a block diagram of a near-field sensor, according to embodiments of the present disclosure.

Referring to FIG. 2, according to some embodiments of the present disclosure, a near-field sensor 200 can include a transmitter 202, a power amplifier (PA) 204, a transmit matching network 206, an antenna system 208, a receive matching network 210, a low-noise amplifier (LNA) 212, and a receiver 214. Transmitter 202 can be configured to generate transmit signals. In embodiments, the transmit signals may be pulses. The transmit signals may be amplified by PA 204 and the resulting amplified transmit signals may be transmitted by antenna system 208. Antenna system 208 may be shared between the sensor's transmit and receive portions. In particular, signals received by antenna structure 208 may be provided to receiver 214 by way of LNA 212. Receiver 214 may be provided as an RF receiver configured to receive and process signals received in the near-field of the antenna included in antenna system 208 (so-called "near-field signals" i.e. signals emitted by or generated by a target existing in the near-field of the antenna included in antenna system 208 referred to herein as "near-field targets").

As discussed above, near-field sensing applications can involve transmitting a strong transmit pulses and receiving a relatively weak signal from a target in response (e.g., a transmit pulse can have a power that is at least 10 orders of magnitude greater than a received signal). The near-field sensor 200 may include one or more features to isolate the transmit and receive portions and to suppress stored energy (sometimes referred to as "ringing") that remains in the sensor's circuitry (e.g., within antenna system 208) after the transmit excitation is removed.

Figure 3:
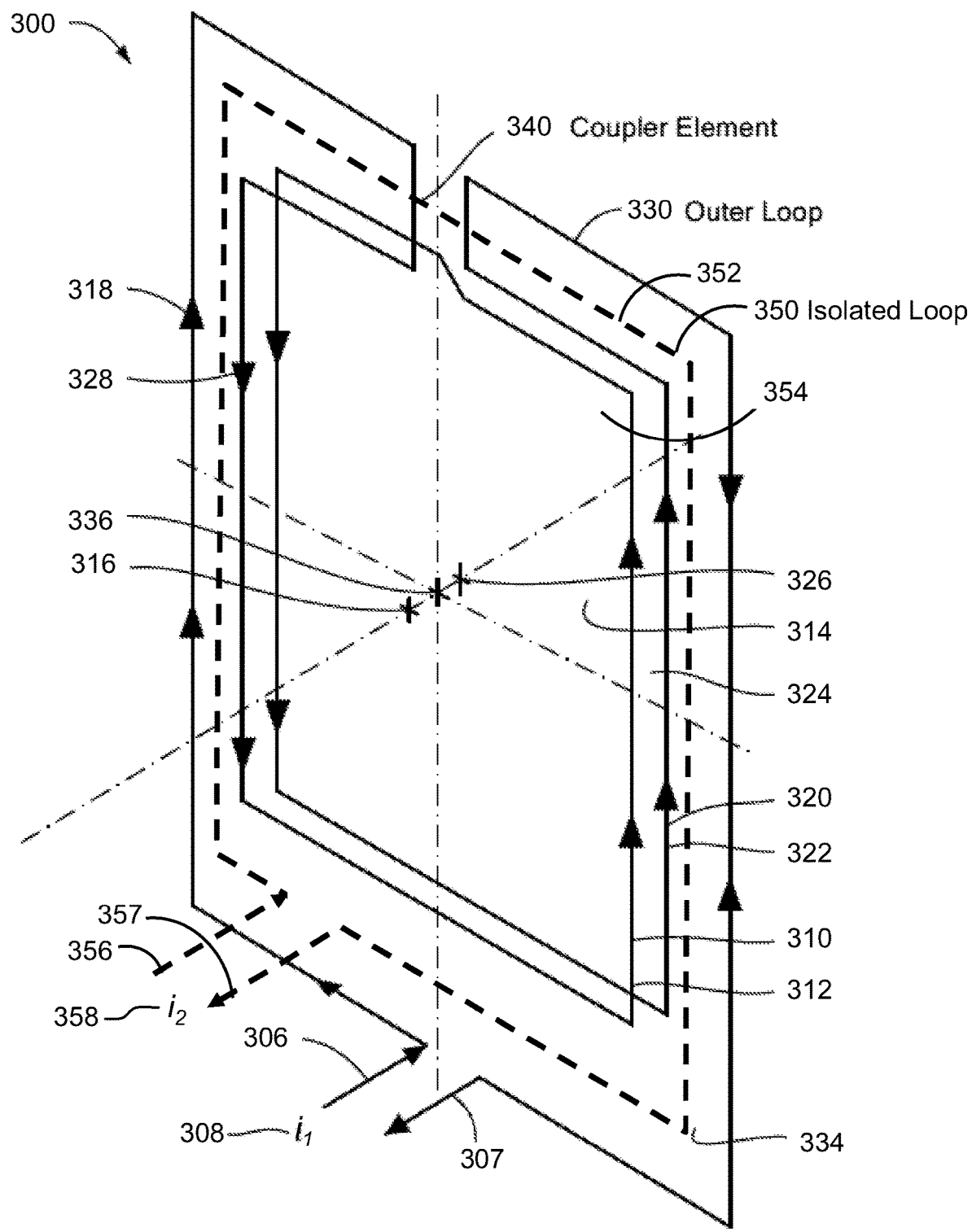
FIG. 3 is a perspective view of an antenna system that can be used within a near-field sensor, according to embodiments of the present disclosure.

In some embodiments, antenna system 208 may be provided as a diplexed antenna having isolated transmit and receive loops coupled, respectively, to transmit matching network 206 and receive matching network 210. Examples of antennas that can be used within near-field sensor 200 are shown in FIGS. 3, 4, and 4A and described in detail below in conjunction therewith.

Figure 5:
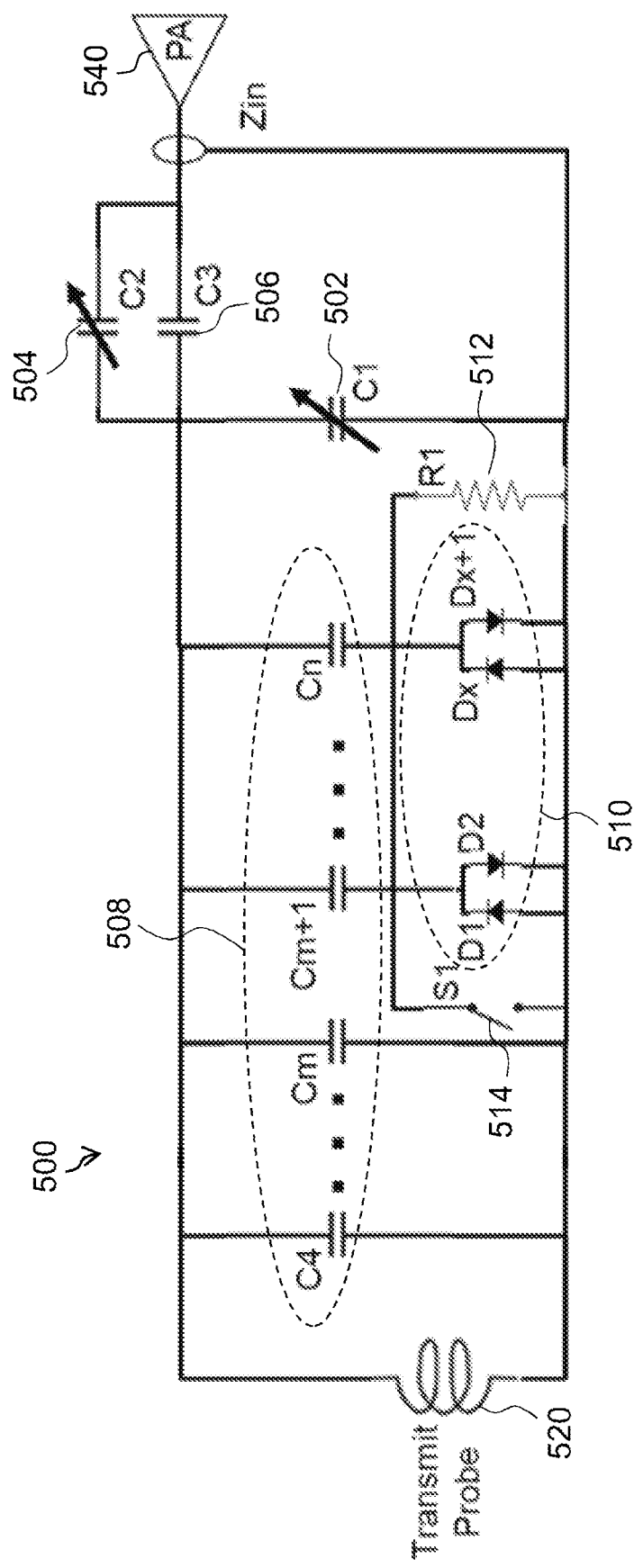
FIG. 5 is a circuit diagram of a transmit matching network that can be used within a near-field sensor, according to embodiments of the present disclosure.
Figure 6:
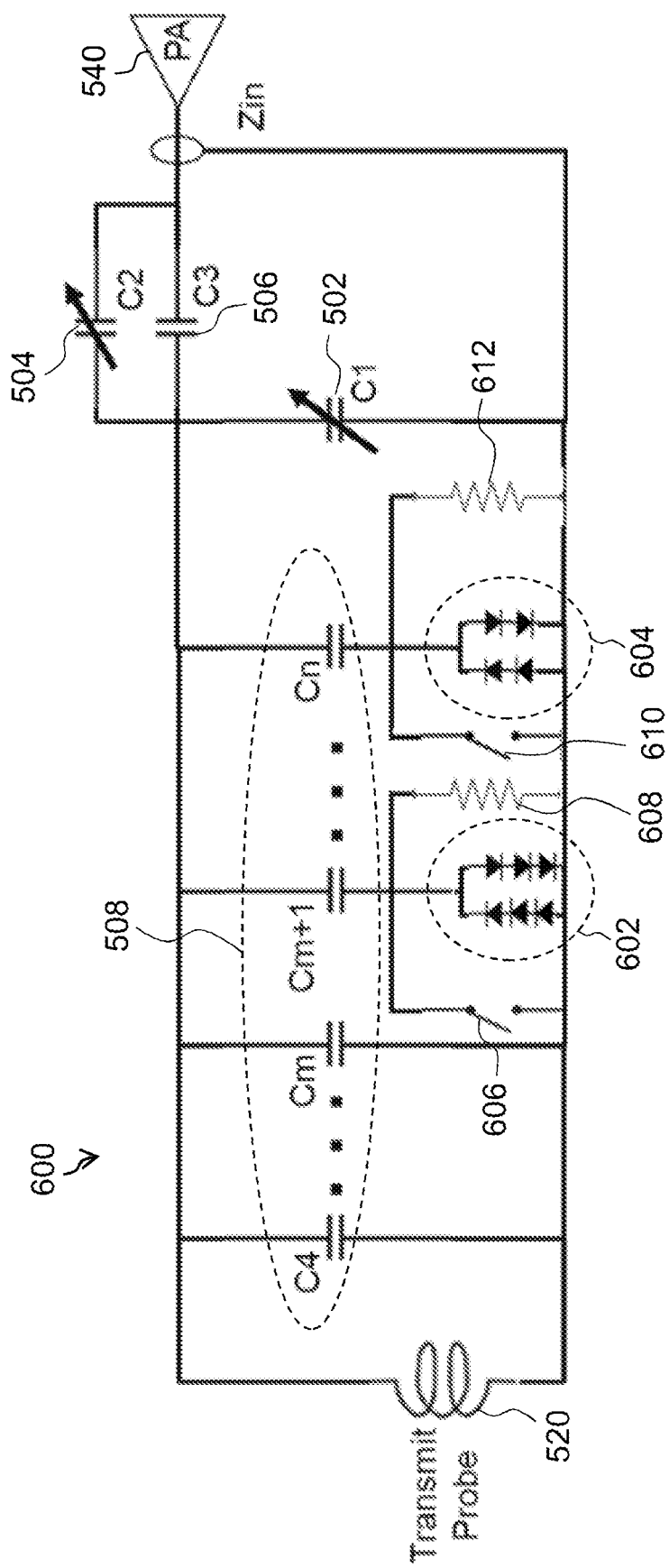
FIG. 6 is a circuit diagram of another transmit matching network that can be used within a near-field sensor, according to embodiments of the present disclosure.

In some embodiments, transmit matching network 206 may be coupled between PA 204 and antenna system 208. Transmit matching network 206 may include hardware components and circuitry configured to suppress stored energy that remains in the antenna system 208 after the transmit excitation is removed. Examples of transmit matching networks that may be used within sensor 200 are shown in FIGS. 5 and 6 and described in detail below in conjunction therewith.

Figure 7:
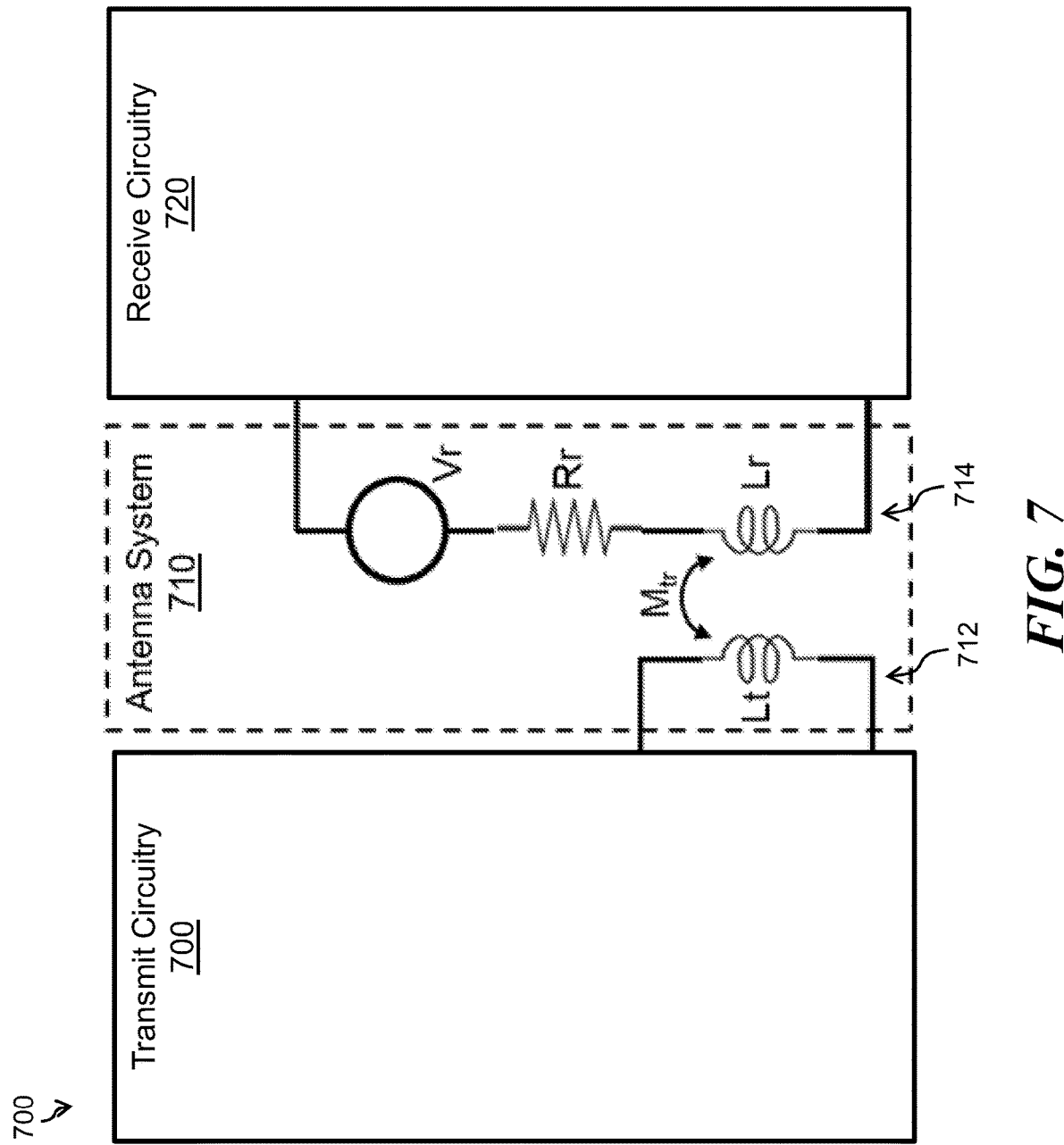
FIG. 7 is a block diagram illustrating residual coupling that can exist between transit and receive circuits in a near-field sensor, according to embodiments of the present disclosure.
Figure 8:
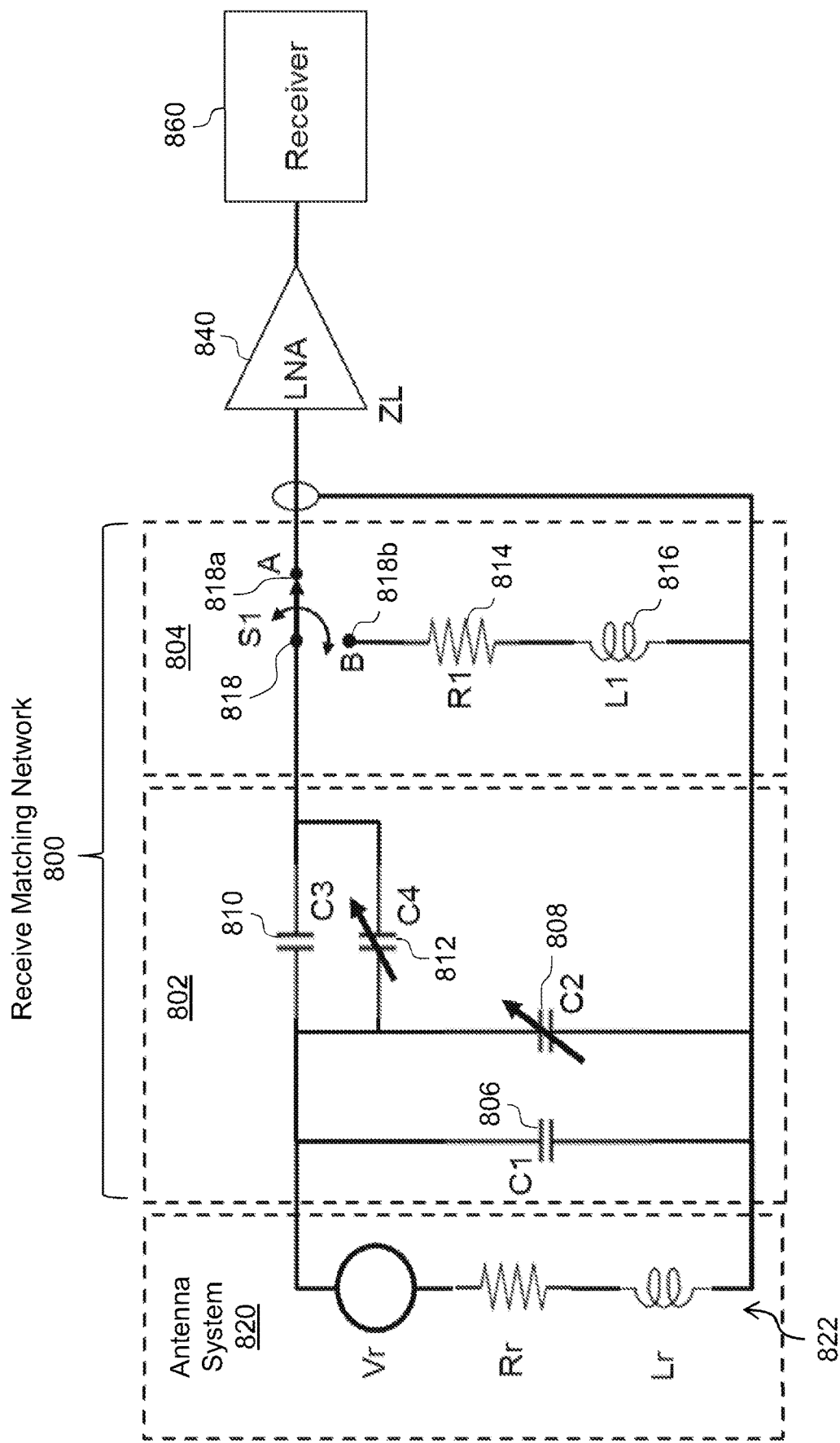
FIG. 8 is a circuit diagram of a receive matching network that can be used within a near-field sensor, according to embodiments of the present disclosure.
Figure 8A:
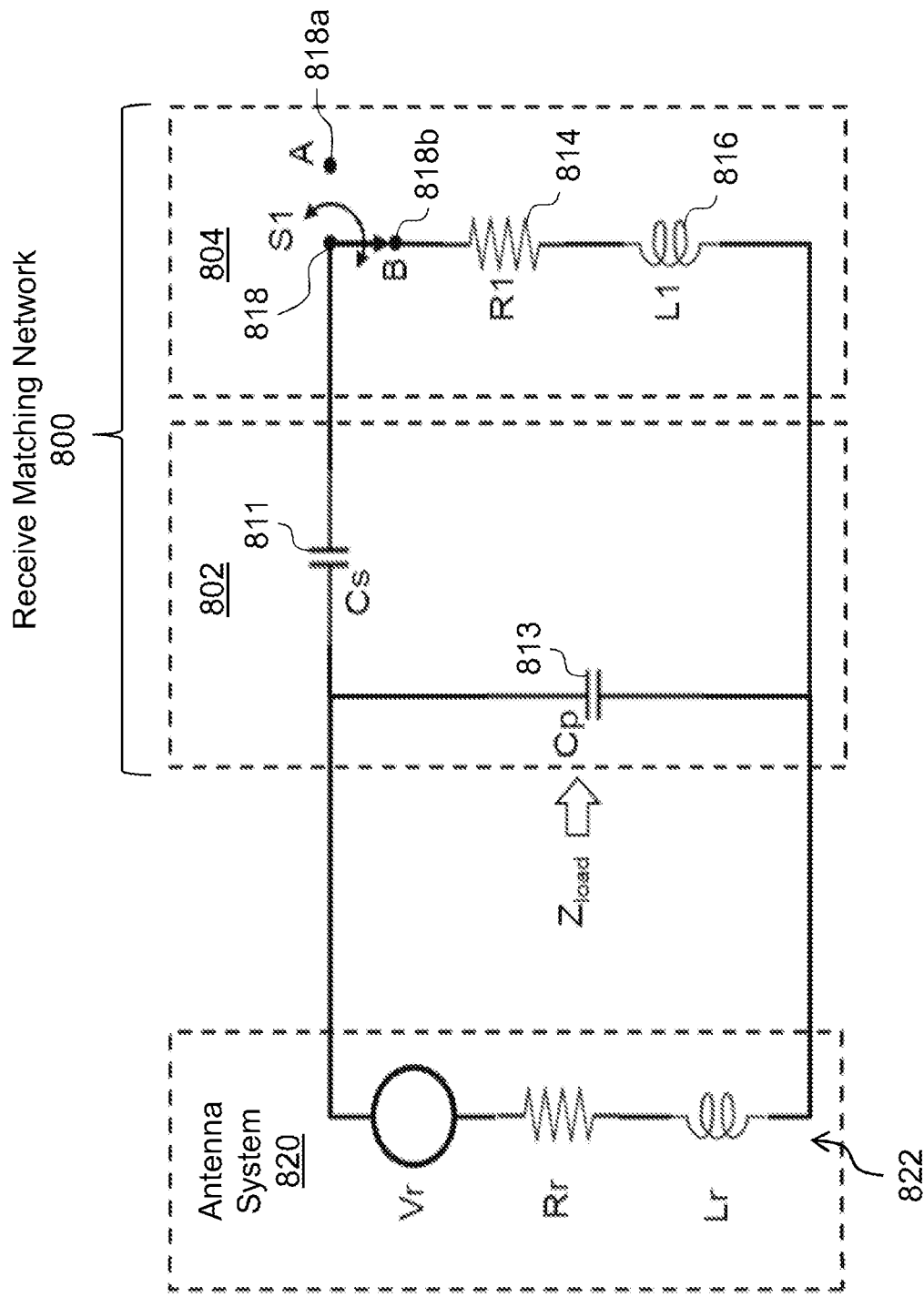
FIG. 8A is a simplified circuit diagram of the receive matching network shown in FIG. 8.

In some embodiments, receive matching network 210 may be coupled between antenna system 208 and LNA 212. Receive matching network 210 may include hardware components and circuitry configured to suppress stored energy that remains in the antenna system 208 after the transmit excitation is removed. Examples of receive matching networks that may be used within sensor 200 are shown in FIGS. 7, 8, and 8A and described in detail below in conjunction therewith.

In some embodiments, near-field sensor 200 can further include a controller 216 having hardware, software, or a combination thereof configured to control operation of the sensor 200. In some embodiments, controller 216 may be used to control one or more switches/relays within transmit matching network 206, as discussed in detail below in conjunction with FIGS. 5 and 6. In some embodiments, controller 216 may be used to control one or more switches/relays within receive matching network 210, as discussed in detail below in conjunction with FIGS. 8 and 8A. In some embodiments, controller 216 can be implemented as special purpose logic circuitry, e.g., an FPGA (field programmable gate array) or an ASIC (application specific integrated circuit).

FIG. 3 shows an illustrative antenna system 300 that can be used within a near-field sensor, according to embodiments of the present disclosure. The antenna system 300 includes two conductive paths (or "probes") electrically isolated from each other within the antenna system 300. That is, the magnetic coupling between loops of the first conductive path and loops of the second conductive may be substantially zero.

The first conductive path can include a first loop 310 having at least one first conductor 312, a second loop 320 having at least one second conductor 322, and a third loop 330 coupled to the first and second loops 310, 320. The first loop 310 has a first enclosed area 314 defined by the area inside the perimeter of the first loop 310 and a first center point 316 defined by the geometric center point of the first enclosed area 314. The second loop 320 can be coupled to the first loop 310 and disposed adjacent to and substantially parallel to the first loop 310. The second loop 320 has a second enclosed area 324 substantially equal to the first enclosed area 314 and a second center point 326. A line normal to the plane of the first loop 310 passes through the first center point 316 and the second center point 326. The third loop 330 can be substantially parallel to the first loop 310 and have an outer enclosed area 334 equal to the sum of the first and second enclosed areas 314, 324. In this configuration, the third loop 330 may be referred to as the "outer" loop 330. The third loop 330 also has an outer center point 336 coincident to the first center point 316. The antenna system 300 may further include a coupler element 340 to couple the third loop 330 to one of the first and second loops 310, 320.

With this configuration of the first conductive path (or "probe"), characterized by a third loop 330 surrounding inner loops 310, 320, the third loop 330 having an enclosed area equal in size to the sum of each of the inner loop enclosed areas, the far-field radiation is cancelled to a high degree, while the near-field energy is not as substantially impacted. Far-field radiation cancellation is dependent on the inner loops 310, 320 having substantially equal enclosed areas. The inner loops 310, 320 produce a substantially higher near-field energy peak along the axis coincident to the inner loops 310, 320. Thus, the reduction in the near-field energy is not complete. Rather, a usable level of near-field energy can be produced at greater distances from the antenna system 300 while maintaining radiation levels low enough to satisfy prevailing governmental RF radiation regulations. In addition, the cancellation of the far-field can result in higher system efficiency. One limitation on RFID operating range is the accuracy of the sizing, the relative placement, and the orientation of the inner and outer loops such that respective enclosed areas are equal and center points coincident. These characteristic makes the probe especially useful in near field sensing applications, such as part of an interrogator of HF RFID tags and in the detection of counter-band materials, such as illegal drugs and explosives.

The second conductive path includes a fourth loop 350 having at least one conductor 352. While the embodiment of FIG. 3 shows a total of four (4) loops (i.e., three loops 310, 320, 330 along the first conductive path and an additional loop 350 along the second conductive path), the structures and techniques sought to be protected herein are not limited to any particular number of loops. For example, the first conductive path may have fewer than, or more than, three loops in other embodiments. The terms "first loop," "second loop", "third loop", "fourth loop", etc. are used herein for clarity and are not intended to be limiting.

The fourth loop 350 can be sized and positioned such that it is electrically isolated from first conductive path. That is, loop 350 may be isolated from loops 310, 320, 330 and conductors 312, 322. As shown in FIG. 3, in some embodiments, fourth loop 350 can be substantially parallel to first loop 310 and may be positioned in or near the plane of first loop 310, second loop 320, or third loop 330. That is, the fourth loop 350 can have an enclosed area 354 defined by the area inside the perimeter of the fourth loop 350 and a center point defined by the geometric center point of the enclosed area 354, where the center point is coincident with the first center point 316, the second center point 326, or the third center point 336.

In some embodiments, the size of the fourth loop 350 may be controlled such that the magnetic flux from the inner loops 310, 320 passing through the fourth loop 350 is substantially equal to the flux from the outer loop 330. It is noted that the direction (or "sense") of the current flow in the inner loops 310, 320 and outer loop 330 is forced by the couplings (i.e., connections) of the two sets of loops to be in the opposite direction. That is, if the current is flowing in the clockwise direction through the inner loops 310, 320, then the current is forced to flow in the counterclockwise direction in the outer loop 340. Thus, the flux generated by the two sets of loops (inner loops 310, 320 and outer loop 330) is also opposing. Thereby the net magnetic flux passing through the properly sized and positioned additional (or "fourth") loop 350 as a result of the current in the others is made to net to zero or approximately zero. As a result, zero (or substantially zero) voltage is induced as a result of current flowing in the probe comprised of inner loops 310, 320 and outer loop 330.

With this configuration, the second conductive path is operable as an independent probe, for example as a transmit probe, while the first here loops 310, 320, 330 remain unaffected by the presence of the additional loop 350. That is, the first conductive path can remain independently operable, for example, as a receive probe. It is appreciated herein that having two independent probes which interact with the same volume in their vicinity provides advantages over conventional sensors that use a single loop for both transmit and receive functions. In the configuration of FIG. 3, the fourth loop 350 may be referred to as the "isolated" loop 350.

The antenna system 300 can include separate feed elements and separate return elements for each of the conductive paths. In particular, as shown in FIG. 3, a first feed element 306 can supply a current 308 in a first polarity 318 to the third loop 330 and the coupler element 340 supplies the current 308 in a second polarity 328 to the one of the first and second loops 310, 320. The second polarity 328 is opposite to the first polarity 318. A first return element 307 is included to return the current 308 to, for example, receiver circuitry. Likewise, the antenna system 300 can include a second feed element 356 to supply current 358 to the fourth loop 350, and a second return element 307 to return the current 358 to, for example, transmit circuitry. In some embodiments, and as described in more detail below, first feed element 306 and first return element 307 may be coupled to a port of a receive matching network, and second feed element 356 and the second return element 357 may be coupled to a port of a transmit matching network.

While the embodiment of FIG. 3 shows fourth loop 350 as a single turn loop positioned in or near the plane of loops 310, 320, 330, other configurations are possible. For example, as shown in FIGS. 4 and 4A, in some embodiments a diplexed near-field antenna can include loops in two or more different planes.

FIGS. 4 and 4A show another design for an antenna system 400 that can be used within a near-field sensor, according to some embodiments. The illustrative antenna system 400 includes a first conductive path and a second conductive path electrically isolated from each other.

The first conductive path can include a first loop 410, a second loop 420 coupled to the first loop 410, and a third loop 430 coupled to the first and second loops via a coupler element 440. The first loop 410 has a first enclosed area 414 defined by the area inside the perimeter of the first loop 410 and a first center point 416 defined by the geometric center point of the first enclosed area 414. The second loop 420 can be coupled to the first loop 410 and disposed adjacent to and substantially parallel to the first loop 410. The second loop 420 has a second enclosed area 424 substantially equal to the first enclosed area 414 and a second center point 426. A line 460 normal to the plane of the first loop 410 passes through the first center point 416 and the second center point 426. In some embodiments, the first center point 416 and the second center point 426 may be coincident. That is, first loop 410 and second loop 420 may be within the same plane, as illustrated in FIGS. 4 and 4A. The third loop (or "outer loop) 430 can be substantially parallel to the first loop 410 and may have an outer enclosed area 434 equal to the sum of the first and second enclosed areas 414, 424. The third loop 430 also has an outer center point 436. The antenna system 400 may further include a coupler element 440 to couple the third loop 430 to one of the first and second loops 410, 420.

The second conductive path includes a fourth loop (or "isolated loop") 450 having at least one conductor. The fourth loop 450 can be sized and positioned such that it is electrically isolated from first conductive path, i.e. isolated from loops 410, 420, 430. As illustrated in FIG. 4A, in some embodiments, fourth loop 450 can be substantially parallel to first loop 410 and may be positioned in or near the plane of first loop 410 and second loop 420. That is, the fourth loop 450 can have an enclosed area 454 defined by the area inside the perimeter of the fourth loop 450 and a center point 456 defined by the geometric center point of the enclosed area 454, where center point 456 is coincident with first center point 416 and second center point 426. As illustrated in FIG. 4A, in some embodiments, third loop 430 may be positioned in a separate plane parallel to the plane of loops 410, 420, and 450. Thus, the antenna system 400 may be bi-planar.

Having a bi-planer configuration such as illustrated in FIGS. 4 and 4A can provide greater spacing between the transmit and receive functions. Principally, this is because the greater transmit power can result in relatively high voltages to be present on the transmit probe. Increasing the spacing by placing the two functions in two planes can permit higher voltage to be accommodated. It can also reduce the capacitive coupling between the transmit and receive probes within the antenna system, which can provide improved performance of the transmit and receive functions.

With this configuration, the second conductive path is operable as an independent probe, for example as a transmit probe, while the first here loops 410, 420, 430 remain unaffected by the presence of the additional loop 450. That is, the first conductive path can remain independently operable, for example, as a receive probe. It is appreciated herein that having two independent probes which interact with the same volume in their vicinity provides advantages over conventional sensors that use a single loop for both transmit and receive functions.

The antenna system 400 can include separate feed elements and separate return elements for each of the conductive paths. In particular, as shown in FIG. 4, a first feed element 406 can supply a first current to third loop 430 and coupler element 440 supplies the first current to the one of the first and second loops 410, 420. In some embodiments, the first current in the third loop 430 may have opposite polarity from the first current in the first and second loops 410, 420. A first return element 407 is included to return the first current to, for example, receiver circuitry. Likewise, the antenna system 400 can include a second feed element 456 to supply a second current to the fourth loop 450, and a second return element 407 to return the second current to, for example, transmit circuitry. In some embodiments, and as described in more detail below, first feed element 406 and first return element 407 may be coupled to a port of a receive matching network, and second feed element 456 and the second return element 457 may be coupled to a port of a transmit matching network.

Turning to FIG. 5, a transmit matching network 500 can be provided with a means to mitigate ringing in a near-field sensor that employs an antenna system having isolated transmit and receive probes (e.g., sensor 200 of FIG. 2), according to embodiments of the present disclosure.

In previous approaches, mitigation of ringing has required active control of a switch or circuit that added complexity to the system. Embodiments of the near-field sensor disclosed herein eliminate the need for an actively controlled switched element, in part, because the antenna system has independent transmit and receive probes, as discussed above in conjunction with FIGS. 3, 4, and 4A. Since the transmit probe is operable independent of the receive probe, it is possible to simplify the suppression of the post excitation ringing in the transmit probe. Specifically, a set of crossed diodes is introduced into the resonant part of the transmit matching network (or "tuning network") 500 of the transmit loop. These passive components are sufficient to reduce the time for the energy stored in the narrow-band transmit probe to be dissipated.

Referring to the embodiment of FIG. 5, a transmit matching network 500 coupled between a transmit probe 520 and a power amplifier (PA) 540 uses a plurality of diodes disposed within a two element L-network. This arrangement results in a reduction in the transmit energy after the end of the transmit pulse which occurs more rapidly than can be achieved using prior art approaches. Transmit probe 520 may correspond to an isolated loop in the antenna system, such as loop 350 of FIG. 3 or loop 450 of FIG. 4. Power amplifier 540 may correspond, for example, to power amplifier 204 shown in FIG. 2.

The network 500 can include a first capacitor (C1) 502, a second capacitor (C2) 504, a third capacitor (C3) 506, and a plurality of capacitors 508 (C4 ... Cm, Cm+1 ... Cn). The first capacitor 502 and each of the plurality of capacitors 508 may be coupled in parallel with the transmit probe 520. The second and third capacitors 504, 506 may be coupled in series with the transmit probe 520. The capacitors in parallel with the transmit probe act to set the center frequency of the matched passband of the tuned probe circuit, while the series capacitors set the impedance level of the match (Zin), nominally 50 ohms in some embodiments.

The transmit matching network 500 can further include a plurality of diodes 510 arranged in series with ones of the plurality of capacitors 508. In particular, a pair of crossed diodes (i.e., two diodes having reverse biases) may be coupled in series with ones of the capacitors 508. For example, as shown in FIG. 5, a first diode (D1) having a first bias and a second diode (D2) have a second opposite bias may be arranged in parallel with each other and in series with a capacitor (Cm+1). In some embodiments, diodes are not placed in series with all of the capacitors. For example, as shown in FIG. 5, diodes may be placed in series with capacitors Cm+1 ... Cn but not with C4 ... Cm. This has the advantageous effect of shifting the resonance when the voltage in the resonant part of the tuning network drops below the forward voltage of the selected diodes, e.g. below 0.5 to 1.5 volt. That is, the diodes become high impedances that block the flow of current through the capacitors in which they are arranged in series (e.g., capacitors Cm+1 ... Cn). Leaving capacitors without series diodes (e.g., capacitors C4 ... Cm) can have the result that any energy remaining in the tank circuit formed by the inductance of the transmit probe 520 and the remaining capacitors (sometimes referred to as "shunt capacitors") is further impeded as the resonant frequency of the remaining tank circuit shifts to a much higher frequency. The capacitors that are not coupled with series diodes (e.g., capacitors C4 ... Cm) may be referred to herein as being "directly" coupled across the transmit probe 520. The values of capacitors 502, 504, 506, 508 may be selected based on the design and operating requirements of a given near-field sensor (e.g., based on the geometry and dimensions of the near-field sensor's antenna system).

The network can further include a resistor (R1) 512 and a switching element (Si) 514. Resistor 512 may be placed across diodes 510 and may have a resistance value selected to maximize the dissipation of energy as diodes 510 approach their cut-off voltage level, further speeding the reduction in the energy "ringing" in the circuit.

Switching element 514 can be provided to allow accurate tuning of matching network 500 at low power, where diodes 510 could not be made to properly conduct the small currents involved. Switching element 514 is only subjected to the forward voltage present across the diode pairs when full power is applied. Because the switching element 514 is open during full power operation it need carry only the minimal current needed to enable the low power tune function when it is closed. Thus, it will be appreciated that the requirements of switching element 514 are merely incidental to operation of the transmit probe and matching network 500, in contrast to prior approaches which require an actively controlled switch. In some embodiments, switching element 514 may be mounted proximate to the diodes 510 to minimize stray inductance associated with interconnect conductors, thereby reducing (and ideally minimizing) the difference between the low power tuning measurements and high power operating characteristics. Switching element 514 can be provided, for electromechanical example, as a mechanical switch or an electromechanical device such as a relay. In some embodiments, switching element 514 may be controlled by a controller, such as controller 216 of FIG. 2.

In some embodiments, approximately half of the capacitors 508 may be arranged in series with diode pairs 510 to limit the peak current carrying requirement of the diodes. Limiting the current handling requirement has the benefit of reducing the shunt capacitance of each diode, thereby assuring their off impedance at the operating frequency is maximized. Moreover, in this configuration, the current carrying capacity of the diodes 510 needs to support only half of the total current present during full power operation (e.g., during transmission of relatively strong excitation signals or pulse). The current is further divided by the number of diodes placed in parallel in the circuit.

Having read the preceding disclosure, those skilled in the art will appreciate that the presence of an independent transmit probe and the strategic use of diodes greatly simplifies and enhances the performance of circuitry in dissipating the stored energy is the transmit probe when excitation is removed.

Referring to FIG. 6 in which like elements are of FIG. 5 are shown using like reference designators, in some embodiments a transmit matching network 600 can include multiple pairs of diodes in parallel with ones of the plurality of capacitors 508. For example, as shown in FIG. 6, a first one of the plurality of capacitors (Cm+1) may have three pairs of diodes 602 arranged in series, whereas a second one of the plurality of capacitors (Cn) may have two pairs of diodes 604 arranged in series. The multiple pairs of diodes may be arranged as two parallel diode strings, with each of the diodes in the first string may have the same bias that is opposite from that of each of the diodes in the second string. In the configuration of FIG. 6, the network 600 can include a resistor and a switch for each set of diodes that has a different number of diodes in the string. For example, a first switch 606 and a first resistor 608 may be arranged in parallel around diodes 602 having strings of three (3) diodes, whereas a second switch 610 and a second resistor 612 may be arranged in parallel around diodes 604 having strings of two (2) diodes.

Using multiple pairs of diodes increases the cut-off voltage, thereby resulting in damping occurring earlier in time following a transmission of an excitation signals. Further, the use of varying numbers of diodes in series can act to limit the total number of diodes required to effect a selected turn-off voltage. The higher the turn-off voltage, the sooner the diodes begin to shift the circuits resonant frequency and dissipate the residual power after the transmit pulse ends. The reduced number of diodes may lead to a reduction in the power dissipated in the diodes when current is flowing.

Turning to FIG. 7, in a simplified view, a near-field sensor 700 can include transmit circuitry 700, an antenna system 710, and receive circuitry 720. As discussed above in the context of FIGS. 3, 4, and 4A, in some embodiments antenna system 710 can include isolated transmit and receive probes. While this configuration can substantially reduce coupling between the transmit and receive circuits 700, 720, some residual coupling may still exist there between. For example, as depicted in FIG. 7, residual coupling $M_{tr}$ may exist between the transmit probe 712 and the receive probe 714. It may be necessary or desirable to dissipate energy present in the receive circuitry 720 before the near-field detection process can be performed. In some embodiments, a receive matching network can be used to reduce (and ideally minimize) the transfer of energy via the mutual coupling $M_{tr}$, and thereby reduce the time required for remaining energy to fully dissipate from the receive circuit.

Turning to FIG. 8, in some embodiments, a receive matching network 800 can be used to suppress transient signals (or more simply "transients") present in the receive circuit of a near-field sensor following transmission of a transmit pulse), according to embodiments of the present disclosure. For example, such transients may be present in a near-field sensor that employs an antenna system having isolated transmit and receive probes (e.g., sensor 200 of FIG. 2). The illustrative receive matching network 800 can be coupled between the antenna system 820 and receiver 860 or, more particularly, between antenna system 820 and low-noise amplifier (LNA) 840 to which receiver 860 is coupled. To promote clarity in the drawings, only the receive probe 822 of antenna system 820 is shown in FIG. 8.

Receive probe 822 may correspond to a conductive path in the antenna system, such as the conductive path having loops 310, 320, 330 in FIG. 3 or the conductive path having loops 410, 420, 430 in FIG. 4. LNA 840 and receiver 860 may correspond, respectively, to LNA 212 and receiver 214 of FIG. 2. Receive probe 822 has an impedance comprising the inductance of the loops which make up the probe (represented by inductor Lr in FIG. 8) and the loss inherent in the loops (represented by resistor Rr in FIG. 8). The voltage source Vr in FIG. 8 represents the voltage induced in the receive circuit from the transmit circuit. It is equal to the product of the mutual reactance ($j\omega M_{tr}$) and the current in the transmit circuit.

Receive matching network 800 can include a matching portion 802 and a transient suppression portion 804. Matching portion 802, which may be classified as a matching L-network, can include first and second capacitors 806, 808 arranged in parallel with the receive probe 822 and third and fourth capacitors 810, 812 arranged in series with the receive probe 822. The second and fourth capacitors 808, 812 may be variable capacitors, as illustrated in FIG. 8. Transient suppression portion 804 can include a resistor 814, an inductor 816, and a switching element 818.

Switching element 818 can be provided, for example, as a mechanical switch, an electromechanical device such as a relay, or a solid-state relay. As shown in FIG. 8, switching element 818 may be provided as a single pole, double throw switch having a first position 818a and a second position 818b. When switching element 818 is in first position 818a, the signal from probe 822 is passed to the LNA 840, having load impedance (e.g., ZL=50 ohms), and into receiver 860 for detection. When switching element 818 is in second position 818b, resistor 814 and inductor 816 are introduced in place of the LNA's load impedance (ZL) at the output of the receive matching network during and immediately after the transmit pulse. In other words, in first position 818a, switching element 818 provides signal path between probe 822 (i.e., a first conductive path of the antenna system) and the low-noise amplifier, whereas in second position 181b, switching element 818 provides a signal path between probe 822 and the series-coupled resistor 814 and inductor 816.

In some embodiments, switching element 818 may be controlled by a controller, such as controller 216 of FIG. 2. The switching element 818 can be automated as a relay. The matching portion (or "L-network match") 802 can act to transform the relatively low resistance of the high-Q receive probe 822 to match a load impedance (ZL). Placing switching element 818 at the output of the matching portion 802 can reduce its impact prior to the first stage of amplification. For example, in this configuration the switched suppression portion 804 may have a loss resistance that is substantially less than the load impedance (ZL) and therefore may have negligible effect on system sensitivity.

In operation, switching element 818 may be put in second position 818b for the duration of a transmit pulse. In some embodiments, switching element 818 can remain in that position for an additional period of time after the transmit pulse/excitation is removed. The additional period of time may be selected to permit the energy in the transmit circuit to dissipate sufficiently to assure no further energy is being transferred between the transmit and receive circuits. The period of time may be further extended to allow energy which had entered the altered receive circuit to dissipate as well. In some embodiments, the period of time can be selected to be less than 10% of the transmit pulse duration. In other embodiments, the period of time may be between 20% and 40% of the transmit pulse duration. After the transmit excitation is removed and the additional time has elapsed, the switching element 818 may be placed in first position 818a such that the received signal is passed to the LNA 840 and into the receiver 860 for detection.

To improve the effectiveness of this process, inductor 816 may be sized to establish a parallel resonance with the tuning capacitance represented by first capacitor 806 and variable capacitor 808, taking into account the reduction of reactance caused by the series capacitances 810, 812. When properly sized for the desired frequency of operation, this parallel resonance can appear as a relatively high impedance load attached to the output of the receive probe 822. The effect is to minimize the current flow, and thereby the energy stored in the receive probe's circuit. Minimizing the energy storage acts to minimize the time for that energy to fully dissipate, such that the desired signal detection can commence.

FIG. 8A, in which like elements of FIG. 8 are shown using like reference designators, shows a simplified view of receive matching network 800, according to some embodiments. In simplified matching portion 802, both of the L-network arms are shown having a single reactive element that represents the sum of the fixed and variable capacitances in that L-network arm. In particular, capacitor 811

(Cs) represent the series capacitors and capacitor 813 (Cp) represent the parallel capacitors. The simplification can make analysis of the circuit clearer by reducing the number of terms in the following equation:

$$Z_{load} = \frac{X_{L1} \cdot X_{cp} - X_{cp} \cdot X_{CS}}{j(X_{L1} - X_{cp} - X_{cs})}, \quad \text{Eq. 1}$$

where $Z_{load}$ is the impedance presented to the probe by portion 804 of network 800 shown in FIG. 8A.

It can be seen by examination that, ignoring the resistance 814 (R1), the denominator tends toward zero as the inductive reactance ($X_{L1}$) is made to be equal to the sum of the capacitive reactance, i.e. $X_{cp}$ plus $X_{cs}$. Specifically, $$L1 = \frac{|Xcp| + |Xcs|}{\omega_o} \quad \text{Eq. 2}$$

Thus the load impedance presented to the output terminals of the receive probe tends toward infinity. The presence of resistor 814 (R1), being the loss in a realizable inductor, limits the absolute maximum value of the impedance achieved. In addition, it may be useful to augment the inductor loss to limit the Q of the resonant circuit formed by L1 and the two capacitors 811, 813 (Cs and Cp). Though reducing the Q of this resonance reduces the maximum current suppression in the receive probe matching circuit somewhat, it has the advantageous effect of limiting any ringing resulting from the transient that can occur when switching element 818 is changed from second position 818*b* to first position 818*a*.

The current that flows in the receive circuit when the probe is conjugate matched is equal to the impressed voltage (Vr) divided by twice the resistance (Rr) of the probe 822. The inductive reactance of the probe 822 is zeroed by the opposite reactance of the resultant tuning capacitive reactance of the matching load and the resistance of the matching load is equal to that of the probe and added to it in the resulting circuit. That is, $$I_m = \frac{V_r}{2R_r} \quad \text{Eq. 3}$$

The current that flows when the LNA load is replaced by the inductor 816 (L1) can be expressed as:

$$I_n = \frac{V_r}{R_r + Z_{load}} \quad \text{Eq. 4}$$

Taking the ratio of the two current conditions gives:

$$\text{Ratio} = \frac{I_n}{I_m} = \frac{2R_r}{R_r + Z_{load}} \quad \text{Eq. 5}$$

Figure 9:
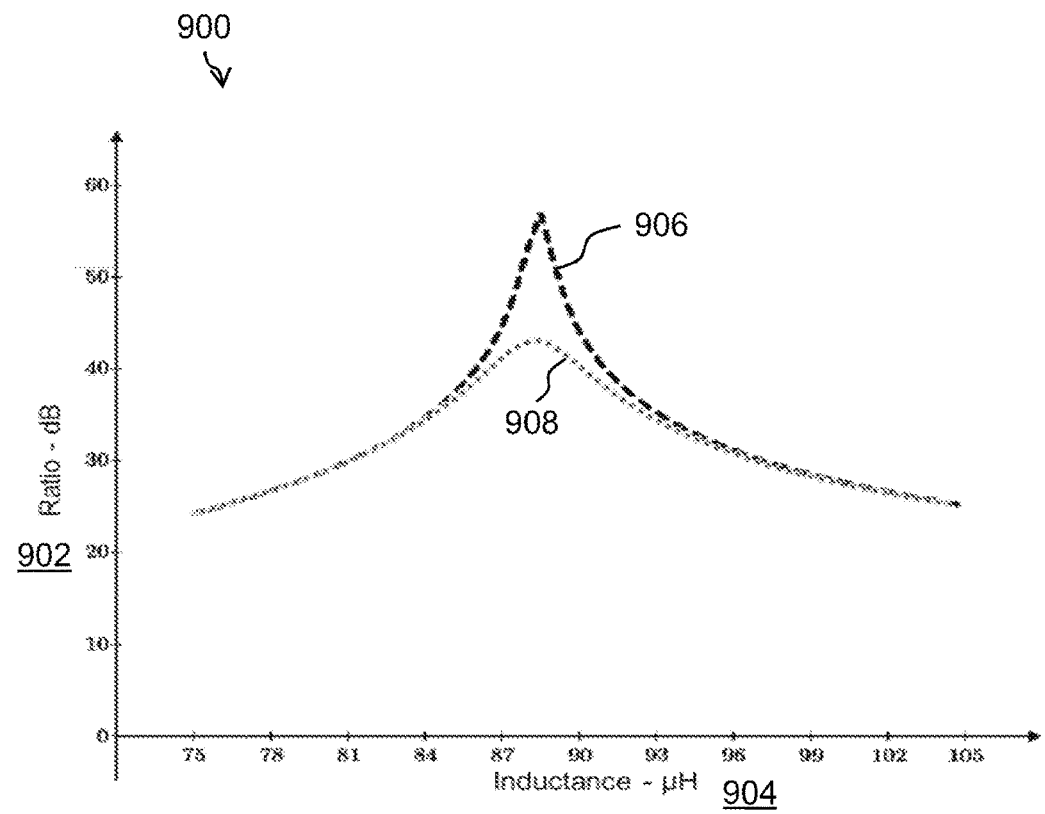
FIGS. 9 and 10 are plots showing illustrative performance characteristics of a near-field sensor, according to embodiments of the present disclosure.

FIG. 9 shows a plot 900 of this ratio 902 as a function of inductance 904 for an example probe having an inductance of 6.5 µH and an unloaded Q of 225. The load resistance of the inductor 816 (L1) was set to yield a high Q of 250 (dashed line 906) and a low Q of 50 (dotted line 908). Though the lower Q yields a lower peak current suppression ratio, it is noted that deviation from the optimum value does not eliminate the suppression of the unwanted current flow. This demonstrates how multiple frequencies can be effectively supported by a single value of the transient suppression inductor 816 (L1).

Figure 10:
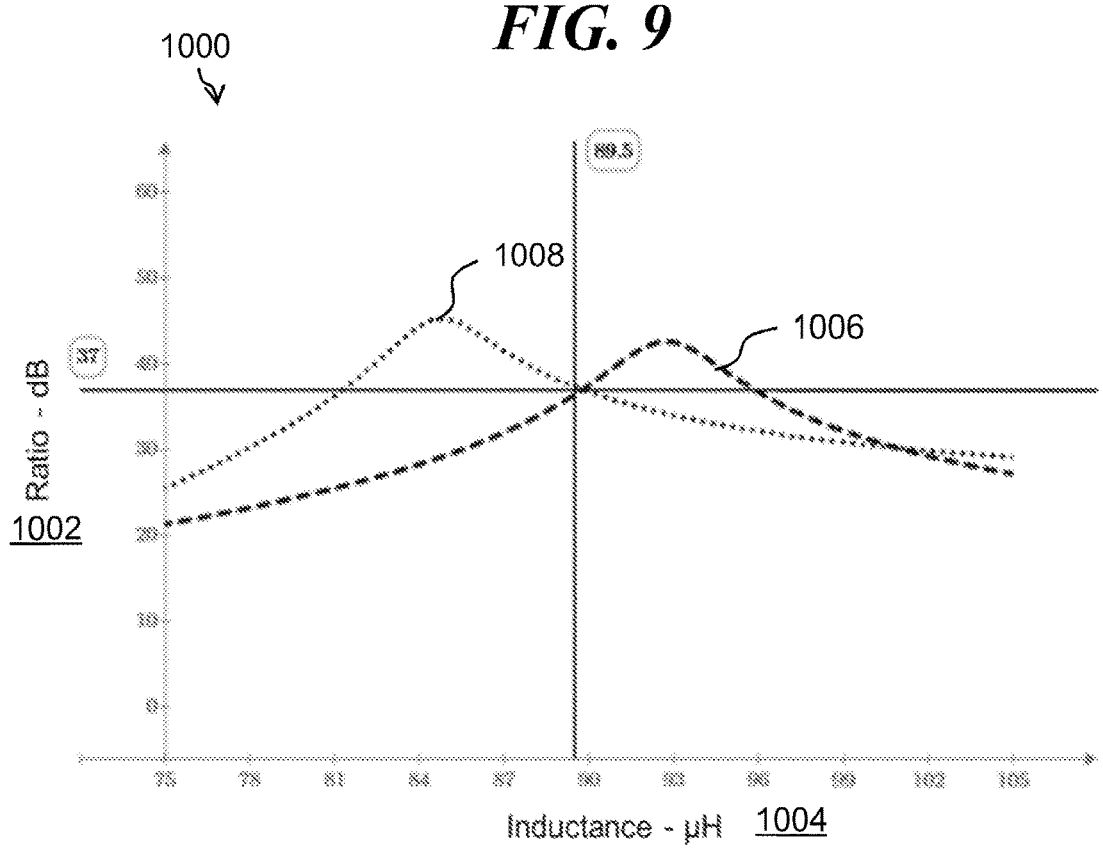

FIG. 10 shows another plot 1000 of the ratio 1002 (i.e., the ratio from Eq. 5 above) as a function of inductance 1004. Plot 1000 shows the effect of using a single value of inductor in support of a 20% excursion in frequency around the center frequency used in FIG. 9. The dashed line 1006 illustrates the suppression achieved as a function of inductance with a Q of 50 for a frequency 10% below the center frequency and the dotted line 1008 is for a frequency 10% above the center frequency. If the value of the inductor 816 (L1) at the midpoint between them is selected for use over that band, the reduction in transient current suppression (and possibly the maximum reduction in transient current suppression) can be limited to about 10 dB. Thus, it will be appreciated that with the addition of as few as two components a reduction in the time it takes for the energy of the transmit pulse to be dissipated is achieved. In some embodiments, additional switching could be used to increase (and ideally optimize) the suppression factor at select frequencies (and possibly each frequency) relative to the suppression factor achievable in prior art systems. Such an increase, however, may be at the expense of added system complexity.

It is to be understood that the disclosed subject matter is not limited in its application to the details of construction and to the arrangements of the components set forth in the following description or illustrated in the drawings. The disclosed subject matter is capable of other embodiments and of being practiced and carried out in various ways. Also, it is to be understood that the phraseology and terminology employed herein are for the purpose of description and should not be regarded as limiting. As such, those skilled in the art will appreciate that the conception, upon which this disclosure is based, may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter.

The invention claimed is:

1. A near-field sensor device comprising:
   an antenna system including:
      a first conductive path having one or more loops coupled together, and
      a second conductive path having one or more loops coupled together,
      wherein the first conductive path is electrically isolated from the second conductive path within the antenna system;
   transmit circuitry configured to transmit pulses via the antenna system, the transmit circuitry including:
      a first port coupled to a power amplifier,
      a second port coupled to the second conductive path, and a transmit matching network coupled between the first and second ports, the transmit matching network configured to dissipate energy stored in the transmit circuitry following transmission of a pulse; and receive circuitry configured to receive interrogation signals in response to transmitted pulses, the receive circuitry including:
a third port coupled to the first conductive path,
a fourth port coupled to a low-noise amplifier, and
a receive matching/suppression network coupled between the third and fourth ports, the receive matching/suppression network configured to dissipate residual energy within the receive circuitry resulting from transmission of the pulse.

2. The device of claim 1 wherein the transmit matching network comprises:
a plurality of capacitors coupled in parallel between the first and second ports; and
for each of one or more of the plurality of capacitors, a pair of crossed diodes coupled in series with the capacitor.

3. The device of claim 2 wherein the transmit matching network comprises:
a first number of pairs of crossed diodes coupled in series with a first one of the plurality of capacitors; and
a second number of pairs of crossed diodes coupled in series with a second one of the plurality of capacitors, wherein the first and second numbers of pairs of crossed diodes are different.

4. The device of claim 2 wherein, in the transmit matching network, at least one of the plurality of capacitors is directly coupled to the second conductive path of the antenna system.

5. The device of claim 2 wherein the transmit matching network comprises, for each of the one or more of the plurality of capacitors:
a switching element coupled in parallel with the pair of crossed diodes; and
a resistor coupled in parallel with the pair of crossed diodes.

6. The device of claim 1 wherein the receive matching/suppression network includes:
an impedance matching network coupled to the third port; and
a transient suppression network coupled to the impedance matching network and the fourth port.

7. The device of claim 6 wherein the impedance matching network comprises:
one or more first capacitors coupled in parallel to the third port; and
one or more second capacitors coupled in series with the one or more first capacitors.

8. The device of claim 6 wherein the transient suppression network comprises:
a network coupled in parallel between the third and fourth ports;
an inductor coupled in series with a resistor coupled in parallel between the third and fourth ports; and
a switching element having a first position and a second position, wherein the switching element is configured to:
in the first position, provide signal path between the first conductive path and the low-noise amplifier, and
in the second position, provide signal path between the first conductive path and the series-coupled resistor and inductor.

9. The device of claim 1 wherein the one or more loops of the first conductive path are disposed within and substantially parallel to the one or more loops of the second conductive path.

10. The device of claim 1 wherein the one or more loops of the first conductive path are oriented along a first plane and the one or more loops of the second conductive path are oriented along a second plane offset from the first plane.

11. The device of claim 1 wherein the first conductive path includes a first loop having at least one first conductor, a second loop having at least one second conductor, and an outer loop coupled to the first and second loops.

12. A transmit matching network for use in a near-field sensor device having isolated transmit and receive probes, the transmit matching network comprising:
a first port coupled to a power amplifier;
a second port coupled to the transmit probe;
a plurality of capacitors coupled in parallel between the first and second ports; and
for each of one or more of the plurality of capacitors, a pair of crossed diodes coupled in series with the capacitor.

13. The network of claim 12 comprising:
a first number of pairs of crossed diodes coupled in series with a first one of the plurality of capacitors; and
a second number of pairs of crossed diodes coupled in series with a second one of the plurality of capacitors, wherein the first and second numbers of pairs of crossed diodes are different.

14. The network of claim 12 wherein at least one of the plurality of capacitors is directly coupled to the transmit probe.

15. The network of claim 12 comprising, for each of the one or more of the plurality of capacitors:
a switching element coupled in parallel with the pair of crossed diodes; and
a resistor coupled in parallel with the pair of crossed diodes.

16. A matching/suppression network for use in a near-field sensor device having isolated transmit and receive probes, the matching/suppression network comprising:
a first port coupled to the receive probe;
a second port coupled to a low-noise amplifier;
an impedance matching network coupled to the first port; and
a transient suppression network coupled to the impedance matching network and the second port.

17. The network of claim 16 wherein the impedance matching network comprises:
one or more first capacitors coupled in parallel to the first port; and
one or more second capacitors coupled in series with the one or more first capacitors.

18. The network of claim 16 wherein the transient suppression network comprises:
a network coupled in parallel between the first and second ports;
an inductor coupled in series with a resistor coupled in parallel between the first and second ports; and
a switching element having a first position and a second position, wherein the switching element is configured to:
in the first position, provide signal path between the receive probe and the low-noise amplifier, and in the second position, provide signal path between the receive and the series-coupled resistor and inductor.

\* \* \* \* \*